United States Patent [19]

Humphreys et al.

[11] 4,390,101
[45] Jun. 28, 1983

[54] ARTICLE MOUNTING RACK

[76] Inventors: John A. Humphreys, 1125 Hugo Reid, Arcadia, Calif. 91006; Michael D. P. Humphreys, 6008 N. Camellia Ave., Temple City, Calif. 91780

[21] Appl. No.: 219,800

[22] Filed: Dec. 24, 1980

[51] Int. Cl.³ .............................................. A47G 19/08
[52] U.S. Cl. ........................................... 211/41; 46/25
[58] Field of Search .................. 211/41, 189; 46/30, 46/25; 52/593, 594; 248/441 R, 466; 108/64, 91, 114

[56] References Cited

U.S. PATENT DOCUMENTS

| 2,320,951 | 6/1943 | Russell | 211/41 X |
| 2,972,823 | 2/1961 | Grutta | 46/30 X |
| 3,119,154 | 1/1964 | Moore | 52/593 X |
| 3,288,301 | 11/1966 | Kent et al. | 211/41 |
| 4,270,303 | 6/1981 | Xanthopoulos | 46/25 |

FOREIGN PATENT DOCUMENTS

| 2016277 | 10/1971 | Fed. Rep. of Germany | 46/25 |
| 1264926 | 5/1961 | France | 46/25 |

OTHER PUBLICATIONS

Product Engineering, Irwin N. Schuster, Jun. 10, 1963, pp. 96, 97.

Primary Examiner—Francis K. Zugel
Assistant Examiner—Peter A. Aschenbrenner
Attorney, Agent, or Firm—Nilsson, Robbins, Dalgarn, Berliner, Carson & Wurst; Nilsson, Robbins, Dalgarn, Berliner, Carson & Wurst

[57] ABSTRACT

An expandable article mounting rack comprises at least one panel where each panel has a major planar surface with a plurality of laterally resiliently deformable clamping pillars extending therefrom and arranged in a matrix configuration defining orthogonal rows of clamping pillars between which a printed circuit board or other like article can be inserted and held. Each clamping pillar includes an upstanding member having a laterally resiliently deformable portion spaced from the top surface of the panel and a support portion interconnected to the top surface. The deformable portion is positioned so that when an article is positioned between adjacent rows of pillars, the deformable portion will be depressed laterally inwardly and will thus exert a pressing force against the edge of the article so positioned.

13 Claims, 7 Drawing Figures

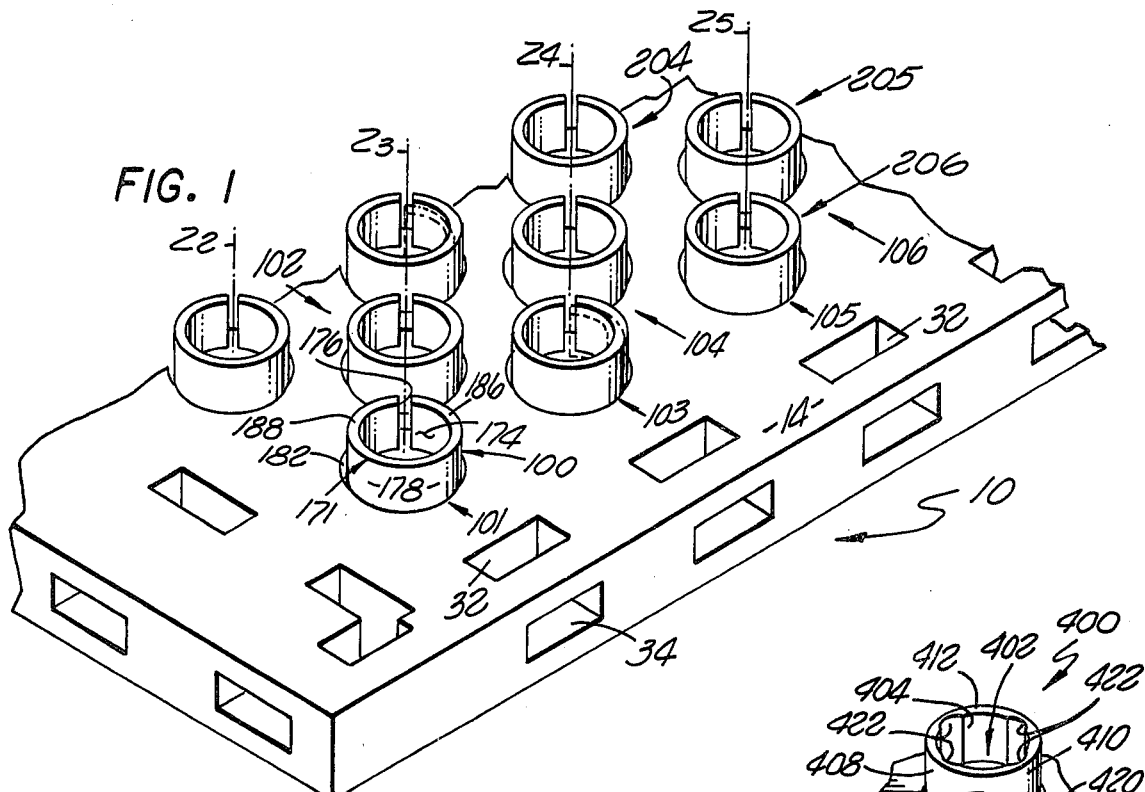
FIG. 1
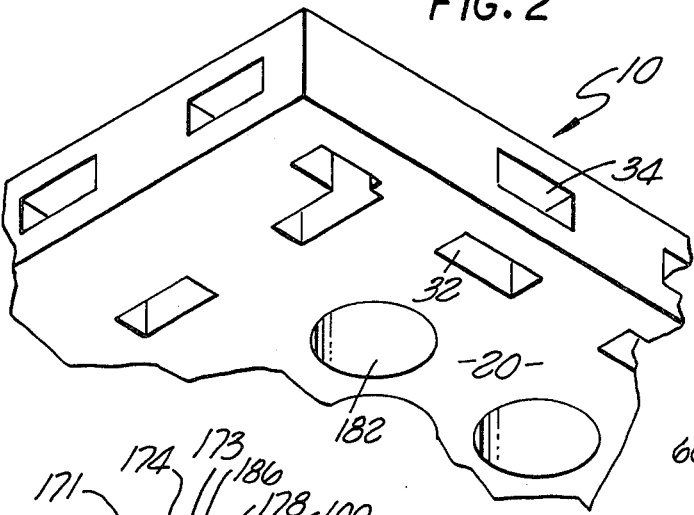
FIG. 2
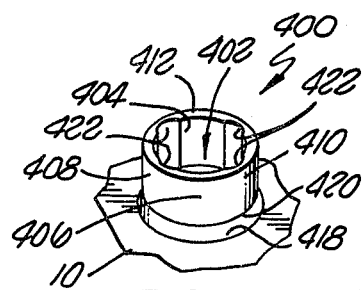
FIG. 4
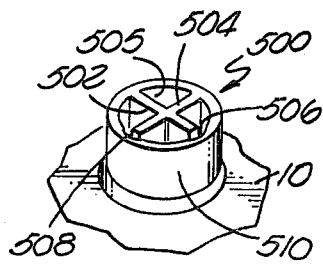
FIG. 5
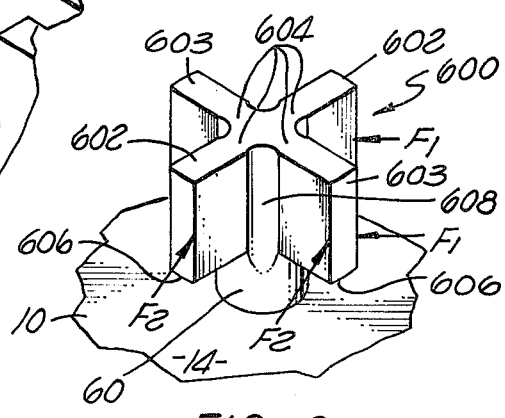
FIG. 7
FIG. 6

ARTICLE MOUNTING RACK

BACKGROUND OF THE INVENTION

The present invention relates to an article mounting rack and in particular to an article mounting rack having one or more panels each of which has a multiplicity of upwardly projecting resiliently deformable clamping pillars for enabling an article to be inserted between adjacent clamping pillars and held thereby.

Present-day electronic systems are generally constructed by mounting a plurality of electrical components or integrated circuits on a printed circuit board and then interconnecting those components by providing conductive strips on one or more surfaces of the printed circuit board. The printed circuit board may have a connector region which is inserted into a connector. The connector may be wired to other similar connectors having similar printed circuit boards with components mounted thereon to electrically interconnect a plurality of circuit boards.

The construction of the printed circuit boards generally proceeds in the following manner: The printed circuit board is first constructed using conventional etching and masking techniques to dispose conductive strips on the surface of an insulative base member. These "printed" boards are then given to assemblers who physically mount the individual components or or integrated circuits on the printed circuit board at predefined locations. Alternatively, the components are mechanically mounted on the printed circuit boards utilizing a suitable assembler machine. Soldering joints are then applied to physically and electrically interconnect the components to the appropriate interconnection points on the board.

The actual mounting and affixing of the individual components to each of these printed circuit boards can be accomplished in a single step or in several sequential steps. However, regardless of the particular assembly procedure, it is often necessary to temporarily store the printed circuit boards between manufacturing steps and after the printed circuit board has been completed but prior to shipment or insertion in the chassis of the electronic equipment.

Such interim storage of the individual printed circuit boards is presently done by providing a slotted piece of wood or by providing a piece of plastic with slotted rails. The individual printed circuits boards are stored by placing them on edge in the slots of either the slotted piece of wood or the slotted rails on the piece of plastic. However, such mounting racks are limited to having a planar configuration and have no capability for expansion or configuration changes. Consequently, a different rack must be made for each size of printed circuit board. Futhermore, such racks have no capability of grasping the printed circuit board making it necessary to maintain the rack in a horizontal orientation to avoid dislodging the printed circuit boards mounted on the rack from their respective slots.

Consequently, it is desired to provide a novel rack having one or more panels which can be removably interconnected in any of a number of different configurations to accommodate different sizes of printed circuit boards and which will be capable of grasping and holding onto each article, such as a printed circuit board, even if the rack is turned upside down. In addition, the rack panels in accordance with the invention are adapted to accommodate a number of different thicknesses of articles to be grasped without modification of the panels.

The present invention thus provides a novel rack apparatus comprising one or more panels where each panel has a plurality of clamping pillars, extending in a matrix configuration from the top surface of each of the panels for grasping and holding the printed circuit boards on the mounting rack in a predefined alignment with a predefined spacing therebetween. The clamping pillars are configured to be laterally resilient so as to accommodate any of a number of different printed circuit board thicknesses.

The above-described invention, while particularly applicable to the storage of printed circuit boards, is also applicable to the storage of any article which is planar and has a narrow width relative to the size of its major planar surface. Thus, a mounting rack in accordance with the invention may be configured to mount silk screen frames.

SUMMARY OF THE INVENTION

A panel for an article mounting rack in accordance with the invention includes a planar member having a top surface and a plurality of clamping pillars arranged to extend from the top surface in a matrix configuration. The clamping pillars define a plurality of parallel first rows of pillars and parallel second rows of pillars which are angled relative to the first rows of pillars. An article may be selectively wedged and held between at least two of the clamping pillars in adjacent parallel rows in the matrix configuration. Each of the clamping pillars arranged in the first and second rows includes an upstanding member having a support portion interconnected to the top surface and a laterally resiliently deformable portion attached to the support portion but spaced from the top surface whereby the deformable portion is laterally deformed when the article is wedged and held between at least two of the clamping pillars in adjacent parallel rows of clamping pillars.

In the preferred embodiment, the matrix configuration of clamping pillars defines a plurality of parallel first diagonal rows each along a different one of a plurality of diagonal axes, first axes and a plurality of parallel second diagonal rows each along a different one of a plurality of second axes wherein the laterally resiliently deformable portion of each upstanding member in each diagonal row is aligned on one side of the upstanding member along the diagonal axes row where each deformable portion in each of the first and second diagonal rows face away from the deformable portion of the adjacent upstanding member along that diagonal row.

In one embodiment of the invention the laterally resilient deformable portion of each upstanding member is located about a first portion of the periphery of the clamping pillars and the support portion is located about a second portion of the periphery of the clamping pillars opposite the first portion.

In another embodiment of the invention the clamping pillar comprises a central core portion attached to the top surface of the pillar and at least one projecting member attached to the central core and extending radially therefrom but spaced above the top surface of the planar member.

The planar member may be provided with a plurality of holes therethrough where each of the holes is arranged to define a plurality of first rows and second rows perpendicular to the first rows. The clamping pillars are interconnected to the top surface with one clamping pillar being adjacent to each of the holes in the planar member so that a portion of the clamping pillar projects over the hole to define a plurality of first rows of pillars and a plurality of second rows of pillars perpendicular to the first rows of pillars. The pillars have a size selected for enabling an article to be selectively wedged and held between at least two of the clamping pillars in adjacent parallel ones of the first and second rows of pillars with the portion of each clamping pillar extending over the hole being laterally deformable for enabling the wedging of the article between adjacent rows of parallel clamping pillars.

The clamping pillar may define a circumferential pillar wall with a circumferential projecting portion projecting over the hole in the planar member and a circumferential attachment portion for attaching the pillar to the top surface of the planar member adjacent the hole through the planar member. The circumferential projecting portion may also have a longitudinal slot therethrough for defining a pair of independently movable legs of the projecting portion.

BRIEF DESCRIPTION OF THE DRAWINGS

A complete understanding of the present invention and of the above and other advantages thereof may be gained from a consideration of the following description of the preferred embodiment taken in conjunction with the accompanying drawings in which:

FIG. 1 is a perspective view of a section of a panel with slotted clamping pillars arranged on the top surface of the panel.

FIG. 2 is a perspective view of a section of the panel of FIG. 1 as viewed from the bottom side of the panel.

FIG. 4 is a detailed perspective view of a grooved clamping pillar in accordance with the invention.

FIG. 5 is a perspective view of a grooved clamping pillar configuration having a pair of radial support members.

FIG. 6 is a perspective view of a flanged clamping pillar in accordance with the invention.

DETAILED DESCRIPTION

Figure 3:
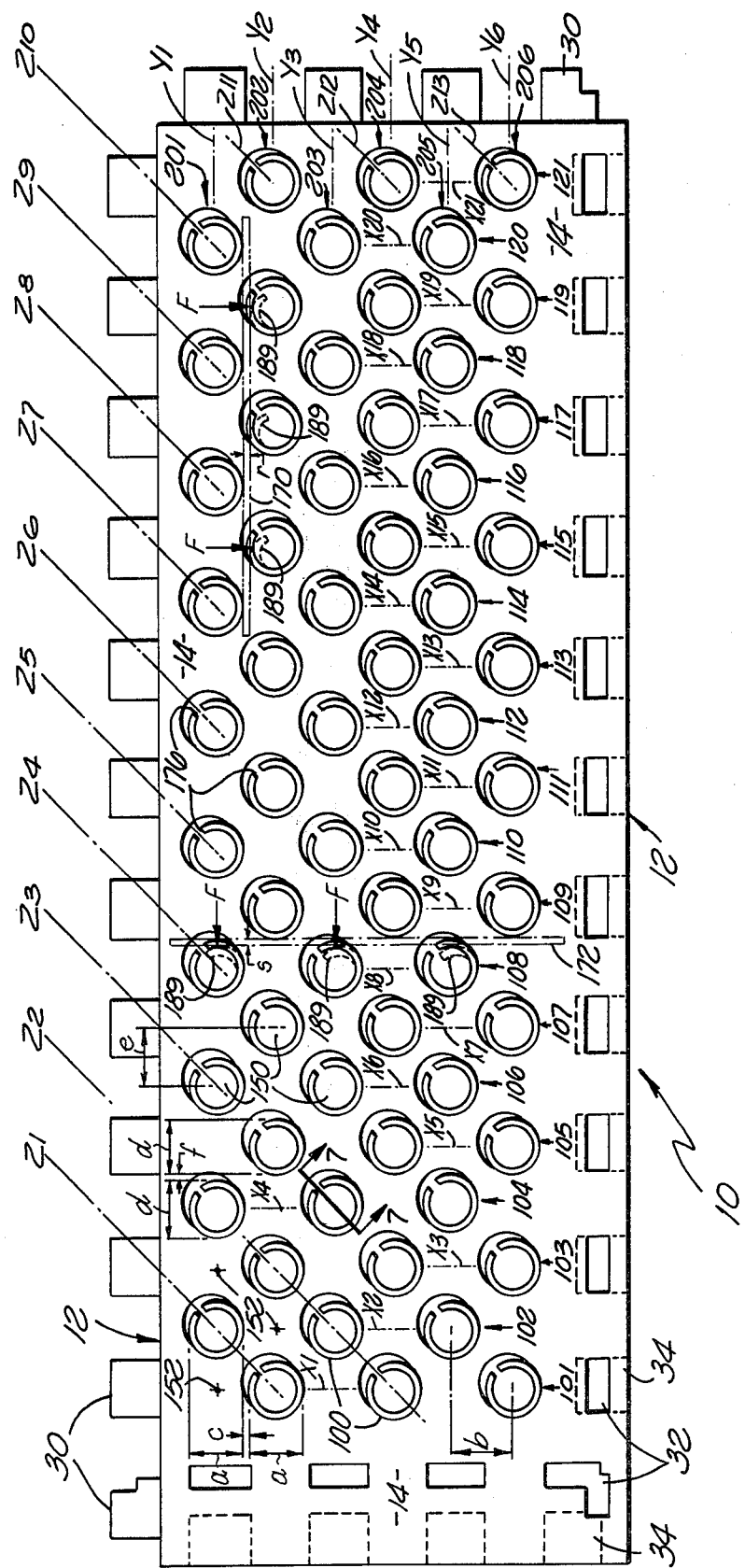
FIG. 3 is a top plan view of the panel of FIG. 1.

Referring first to FIGS. 1, 2 and 3, a panel 10 for mounting articles such as printed circuit boards, framed silk screens or other similar articles having a thin planar configuration is illustrated. The panel 10 is provided with interconnection means enabling two or more panels to be interconnected together either in a plane or at a predefined angle to form an extended article mounting rack. Each panel 10 may be of any suitable shape with a combination of straight or curved peripheral sides and a flat or curved planar surface. However, in most embodiments, each panel 10 is quadrilaterally shaped with a four-sided peripheral skirt 12. For example, in FIGS. 1, 2 and 3, the panel 10 is rectangularly shaped bounded on four sides by the peripheral skirt 12 and having a top surface 14. A plurality of clamping pillars 100 extend from the top surface 14 whereby the printed circuit boards or other articles may be attached and held to the panel 10. Each panel 10 also has a bottom surface 20 which may or may not have the above-described clamping pillars for grasping and holding the article on the mounting rack.

An article mounting rack in accordance with the invention therefore comprises one or more of the panels 10 interconnected together utilizing a plurality of dowels 30, top surface holes 32 and skirt holes.

In accordance with the invention, the clamping pillars 100 are substantially identical in shape and size and are arranged in a matrix configuration over the top surface 14 of the panel 10. For example, in FIG. 3, the clamping pillars 100 are arranged to define a plurality of longitudinal first rows 201, 202, 203, . . . , 206 positioned along a longitudinal first set of parallel central axes Y1, Y2, Y3, . . . , Y6 respectively and a plurality of transverse second rows 101, 102, 103, . . . , 121 positioned along a transverse second set of parallel central axes X1, X2, X3, . . . , X21 transverse to the longitudinal axes Y1, Y2, Y3, . . . , Y6. Each intersection point 150 and 152 between a first axis and a second axis defines a potential center point for the positioning of one of the clamping pillars 100. Of course, a clamping pillar need not be centered at each intersection point 150 and 152. Thus, as shown in FIG. 3, a clamping pillar is centered only at alternate intersection points 150 between each first axis Y1, Y2, . . . , Y6 and each second axis X1, X2, . . . , X21.

Each of the first rows 201, 202, 203, . . . , 206 has a width "a" equal to the width of the clamping pillars in a direction parallel to the second rows 101, 102, 103, . . . , 121. The width "a" is less than a distance "b" between adjacent first axes Y1, Y2, Y3, . . . , Y6 by an amount "c" which is the space between each first row 201, 202, . . . , 206. The spacing "c" is selected to be slightly less than the width "r" of a printed circuit board 170 to be clamped between, for example, the adjacent first rows 201 and 202. Therefore, it is necessary that the pillars be configured to be laterally deformable so that the article, such as a printed circuit board 170, can be inserted into the space between any two adjacent first rows 201, 202, 203, . . . , 206 and be held there by the lateral force exerted by the laterally deformed clamping pillars 100.

Similarly, each of the second rows 101, 102, 103, . . . , 121 has a width "d" which is preferably but not necessarily equal to the width "a" of the first rows 201, 202, . . . , 206. The second row width "d" is less than a distance "e" between adjacent second axes X1, X2, X3, . . . , X21 by an amount "f" which is preferably, but not necessarily, equal to the distance "c". The distance "f" between rows 101, . . . , 121 is thus equal to the space between each adjacent second row 101, 102, . . . , 121. Therefore, in a manner similar to that described above, a printed circuit board 172 having a thickness "s" (which will generally, but not necessarily, be equal to the width "r" of the printed circuit board 170) can be inserted between adjacent second rows such as the adjacent second rows 108 and 109 as illustrated in FIG. 3.

Various structures of clamping pillars are possible to provide the necessary lateral resiliency. Thus, referring to FIGS. 1 and 7, a slotted clamping pillar configuration in accordance with the invention comprises a generally cylindrical upstanding member or portion 171 extending upward from the top surface 14 of the panel 10 and having a central pillar orifice 173 therethrough. The cylindrical member 171 is defined by a laterally deformable portion 174 with a longitudinal slot 176 therethrough, and a support portion 178 laterally opposite the laterally deformable portion 174. The support portion 178 of the slotted pillar 171 is attached to the top surface 14 of the panel 10 about an attachment region 180 which extends about only a portion of the circumference of the slotted pillar 171. A peripheral panel orifice 182 extends through the panel to space the laterally deformable portion 174 from the top surface 14 of the panel 10 about a spaced region 184 which extends about the circumference of the slotted pillar 171 which is not the attachment region 180. The region along the slotted pillar 171 between the end of the attachment region 180 and the end of the spaced region 184 defines a pair of hinge regions 186 and 188.

Referring to FIG. 3, when a printed circuit board such as the printed circuit boards 170 or 172 is inserted in the space between the rows of clamping pillars 201, 202 and 108 and 109 respectively, a force F is exerted against each leg 189 of the laterally deformable portion 174 of one or more of the slotted clamping pillars 100 to thereby deflect the legs 189 inwardly about the hinge portion.

The clamping pillar is made out of a material such as a hard plastic or rubberized material which is resiliently deformable in the lateral direction. Thus, the hinge regions 186 and 188 also act as a spring to press the legs 189 against the surface of the printed circuit boards 170 and 172 to thereby clamp the printed circuit boards between the support portions 178 of the clamping pillars in the respective rows 201 and 109 and the deformable portions 174 of the clamping pillars 100 in the respective rows of clamping pillars 202 and 108.

To facilitate insertion of the printed circuit boards between both adjacent first rows of pillars and adjacent second rows of pillars, on one panel it is preferred that each of the clamping pillars 100 have the same relative orientation on the top surface of the panel 10. Specifically, it is preferred that the slot 176 of each pillar 100 be aligned on the same relative side of the pillar and that the slots be aligned along one of a plurality of diagonal axes 21, 22, ..., 213 which are axes through the intersection points 105 which bisect the angle between each intersection of a longitudinal axes Y1, Y2, Y3, ..., Y6 and a transverse axes X1, X2, X3, ..., X21. Such an orientation is illustrated in FIG. 3.

The purpose of positioning the laterally deformable portion 174 along the bisecting axes 21, 22, ..., 213 is to enable the laterally deformable portion to be deflected inwardly by a printed circuit board inserted either parallel to the axes Y1, Y2, Y3, ..., Y6 or parallel to the axes X1, X2, X3, ..., X21.

Referring next to FIG. 4, an alternative clamping pillar configuration is illustrated comprising a grooved clamping pillar 400 having a cylindrical shape with a central pillar orifice 402 to define a cylindrical interior surface 404 of the clamping pillar 400. As with the slotted clamping pillar configuration of the embodiment shown in FIGS. 1, 2 and 3, the grooved clamping pillar 400 has a laterally deformable portion 406 with a pair of generally orthogonal contact regions 408 and 410 against which a printed circuit board surface will press to deform the laterally deformable portion 406 of the grooved clamping pillar 400 inwardly. The grooved clamping pillar 400 likewise has a rigid support portion 412 opposite the laterally deformable portion 406. A peripheral panel orifice 418 extends through the panel 10 about the lower edge region 420 of the laterally deformable portion 406 of the groove clamping pillar 400.

To facilitate inward deformation of the grooved clamping pillar 400 when a printed circuit board is inserted between adjacent rows of grooved clamping pillars 400, a plurality of lateral deflection grooves 422 are provided to extend longitudinally along several selected locations of the interior cylindrical surface 404.

The grooves 422 each define a hinge region of the grooved clamping pillar 400 which facilitates lateral bending of the contact regions 408 or 410 upon insertion of the printed circuit board in the space between adjacent rows of clamping pillars 400.

Still another alternative embodiment of a clamping pillar in accordance with the invention is illustrated in FIG. 5 where a clamping pillar 500 is provided having the same general characteristics as described in conjunction with FIG. 4. However, in addition to the features shown in FIG. 4, the clamping pillar 500 of FIG. 5 has a pair of deflection limiting support flanges 502 and 504 which are attached and extend from the interior cylindrical surface 505 and terminate a spaced distance from a pair of longitudinal grooves 506 and 508 respectively. The deflection limiting support flanges 502 and 504 thus limit the amount of deflection of the laterally deformable portion 510 of the clamping pillar 500. Thus, when a printed circuit board is inserted and a force is applied against the laterally deformable surface 510, the amount of deflection will be limited to the spacing between the end of the deflection limiting support flanges 502 and 504 and the portion of the interior surface 505 opposite the end of the deflection support flanges 502 and 504, namely, the surface of the grooves 506 and 508 respectively.

Referring finally to FIG. 6, the clamping pillar may comprise a flanged clamping pillar 600 having a central upstanding connecting post 601 a plurality of radially extending flanges 602 each of which is laterally resiliently movable about a hinge region 604. Each of the flanges 602 has a bottom surface 606 which is spaced above the top surface 14 of the panel 10. Thus, the connecting post 601 is attached directly to the top surface 14 and the radial flanges 602 are attached to the post 600 above the top surface 14 to thereby define the spacing between the bottom surface 606 of the flanges 602 and the top surface 14 of the panel 10.

The hinge regions 604 between the upstanding connecting post 601 and the radially extending flanges 602 may be provided in any number of ways including providing spring-loaded hinge mechanisms or any other suitable mechanical means. However, in the preferred embodiment, the hinge region 604 is a narrowed and hence weakened section defined by a plurality of longitudinal grooves 608 which extend along the entire longitudinal length of the attachment region between the flanges 602 and the connecting post 601. The hinges provide a region about which the flanges will pivot when a force F1 or F2 is applied to the outer edges of the flanged clamping pillar shown in FIG. 6.

To provide such pivotal movement about the hinged region, the flanged clamping pillar is preferably made out of a resiliently deformable plastic or rubberlike material.

In the preferred embodiment, the respective pairs of flanges 602 and 603 are orthogonal to each other with each clamping pillar 600 aligned in orthogonal rows as previously described in conjunction with FIGS. 1, 2 and 3. The flanges 602 are then aligned along the diagonals 21, 22, ..., 210. In such an orientation, a printed circuit board inserted between two adjacent rows of flanged clamping pillars along one of the sets of parallel axes will make contact with one edge of one of the flanges 602 and with one edge of one of the flanges 603 causing a force F1 to be exerted on the aforementioned edges causing an inward deflection of adjacent ones of the flanges 602 and 603 about their respective hinged region 604 in the direction of the applied force F1.

Similarly, when a printed circuit board or other article is inserted along the second set of parallel axes along which the flange clamping pillars are aligned, the printed circuit board will make contact with the edges of one each of the flanges 602 and 603 exerting a bending force F2 against the flanges which tends to cause a deflection of the flanges 602 and 603 about their respective hinged regions 604.

Of course, various other configurations of clamping pillars may be devised in accordance with the invention and it is the purpose of the following claims to include all such configurations of clamping pillars which are laterally deformable in the manner herein described.

What is claimed is:

1. A panel for an article mounting rack comprising:
   a planar member having a top surface;
   a plurality of clamping pillars arranged in a matrix configuration along the top surface to define a plurality of parallel first rows of pillars and a plurality of parallel second rows of pillars, the second rows being perpendicular relative to the first rows of pillars whereby the article is selectively wedged and held between at least two of the clamping pillars in adjacent parallel ones of the first and second rows, each clamping pillar comprising an upstanding member having a support portion interconnected to the top surface and a laterally resiliently deformable portion attached to the support portion in spaced relationship to the top surface whereby the deformable portion is laterally deformed when the article is selectively wedged and held between at least two of the clamping pillars in adjacent parallel ones of the first and second rows.

2. The panel of claim 1 wherein the matrix configuration of clamping pillars defines a plurality of parallel diagonal rows along a plurality of parallel diagonal axes wherein the laterally resiliently deformable portion of each upstanding member in each diagonal row is aligned on one side of the upstanding member along the axes for that diagonal row where each deformable portion in each of the diagonal rows face away from the deformable portion of the adjacent upstanding member along the diagonal row.

3. The panel of claim 1 wherein the laterally resilient deformable portion of each upstanding member is located about a first portion of the periphery of the clamping pillars and the support portion is located about a second portion of the periphery of the clamping pillars laterally opposite the first portion.

4. The panel of claim 1 wherein the clamping pillar comprises a central core portion attached to the top surface of the planar member and at least one projecting member attached to the central core and extending radially therefrom in vertically spaced relationship to the top surface of the planar member.

5. The panel of claim 4 wherein each projecting member is attached to the central core by a hinge region biased for maintaining the projecting member in a radially extended orientation.

6. A panel for an article mounting rack comprising:
   a planar member having a top surface;
   a plurality of clamping pillars arranged along the top surface to define a plurality of first rows of pillars and second rows of pillars perpendicular to the first rows of pillars whereby the article is selectively wedged and held between at least two of the clamping pillars in adjacent parallel ones of the first and second rows, each clamping pillar comprising a cylindrical member interconnected to the top surface at a selected location, each cylindrical member having a central hollow core extending longitudinally through both the cylindrical member and the planar member, the planar member further having an orifice therethrough below a first laterally deformable portion of each cylindrical member for separating the first portion of each cylindrical member from the planar member and enabling resilient lateral deformation of the clamping pillar toward the central hollow core in response to a force applied against the outside surface of the first portion of the cylindrical member.

7. A panel for an article mounting rack comprising:
   a planar member with a plurality of holes therethrough, the holes arranged to define a plurality of first rows and second rows perpendicular to the first rows,
   a plurality of clamping pillars each interconnected to the top surface adjacent one of the holes with a portion of the clamping pillar projecting over the hole to define a plurality of first rows of pillars and second rows of pillars perpendicular to the first rows of pillars, the pillars having a size selected for enabling an article to be selectively wedged and held between at least two of the clamping pillars in adjacent parallel ones of the first and second rows of pillars, the portion of each clamping pillar extending over the hole being laterally deformable for enabling the wedging of the article.

8. The panel of claim 7 wherein each clamping pillar has a longitudinal hollow central core therethrough for defining a circumferential pillar wall having a circumferential projecting portion projecting over one of the holes and a circumferential attachment portion for attaching the pillar to the top surface of the planar member.

9. The panel of claim 8 wherein the projecting portion has a longitudinal slot therein for defining a pair of independently movable legs of the projecting portion.

10. The panel of claim 8 wherein the circumferential projecting portion of the circumferential wall of each pillar is slotted along its length to facilitate resilient inward deformation when an article is wedged between the at least two pillars.

11. The panel of claim 8 wherein the interior surface of the circumferential projecting portion of the circumferential wall of each pillar has at least one longitudinal groove therein to facilitate resilient inward deformation when an article is wedged between at least two pillars.

12. The panel of claim 11 wherein each pillar further comprises at least one radial support member in the hollow core extending from the inside surface of the circumferential attachment portion of the circumferential pillar wall, the end of each radial support member being spaced from the inside surface of the circumferential projecting portion for limiting the amount of radial deformation of the pillar.

13. The panel of claim 12 wherein the axial edge of each radial support member is aligned opposite one of the axial grooves in the projecting portion of the circumferential wall.

* * * * *